Aug. 5, 1969 H. BERGER 3,460,056

VOLTAGE TUNABLE L-C OSCILLATOR WITH AMPLITUDE LIMITED POSITIVE FEEDBACK

Filed April 24, 1967

INVENTOR.

HERMANN BERGER

BY

Frank R. Trifari

AGENT

United States Patent Office 3,460,056

Patented Aug. 5, 1969

3,460,056

VOLTAGE TUNABLE L-C OSCILLATOR WITH AMPLITUDE LIMITED POSITIVE FEEDBACK

Hermann Berger, Hamburg, Germany, assignor, by mesne assignments, to U.S. Philips Corporation, New York, N.Y., a corporation of Delaware Filed Apr. 24, 1967, Ser. No. 633,101
Claims priority, application Germany, Apr. 26, 1966, P 39,278
Int. Cl. H03b 3/02
U.S. Cl. 331—109 3 Claims

ABSTRACT OF THE DISCLOSURE

A voltage controlled oscillator which uses a voltage variable capacitor in a resonant circuit. Distortion is prevented in the oscillator output by connecting a linear amplifier to the resonant circuit and by using a limiter in a positive feedback path between the amplifier output and input terminals.

The invention relates to a high-frequency oscillator circuit having a resonant circuit which is tuned by means of a voltage-dependent capacity, for example, a diode.

As a rule it is endeavored to obtain a rather large amplitude of oscillation, for example, in the order of a few volts, at the output of such an oscillator circuit. Owing to the relationship between the applied voltage and the capacity which is desired for the variation of the tuning, it appears that with a rather large drive, for example, by the output voltage of the oscillator, the capacity also varies in accordance with the instantaneous value of the applied alternating voltage of the resonant circuit, in such manner that the oscillations can be deformed. In addition the average value thereof is shifted so that the adjusted frequency depends upon the amplitude of the oscillator oscillations. In the case of driving in the pass region of the variable capacitor a rectifying effect with a strong attenuation of the circuit and detuning thereof occurs.

In an oscillator circuit of the type mentioned in the preamble, these drawbacks are avoided according to the invention by connecting the resonant circuit of the oscillator to the input of a linear alternating voltage amplifier, by connecting the output of the amplifier to a non-tunable impedance, for example, an ohmic resistor or an inductance, and by connecting the amplifier and impedance as an output voltage stabilizing feedback circuit.

The invention is based on the recognition of the fact that only a fraction of the oscillator output amplitude, which is small relative to the maximum driving range of the voltage-dependent capacity, must occur at the voltage-dependent capacity. In that case it is ensured that in the range in which the voltage controls the oscillator frequencies, the capacity remains substantially constant and a disturbing influence is prevented on the shape, frequency-range, frequency and attenuation of the oscillator output. This can be achieved, for example, by connecting the voltage-dependent capacitor through a tap in the inductance of the resonant circuit. However, a considerable reduction of the tuning range occurs, if the value of the voltage-dependent capacity is not increased considerably in accordance with the turns ratio of the resulting autotransformer.

According to the invention, the oscillator is operated so that only low voltages occur at the resonant circuit. Therefore the voltage-dependent capacity can be connected in the normal manner. The required output amplitude is produced by the linear amplifier which also supplies the energy for sustaining the oscillations in the resonant circuit.

In order that the invention may readily be carried into effect, it will now be described in greater detail, by way of example, with reference to the accompanying drawings.

Figure 1:
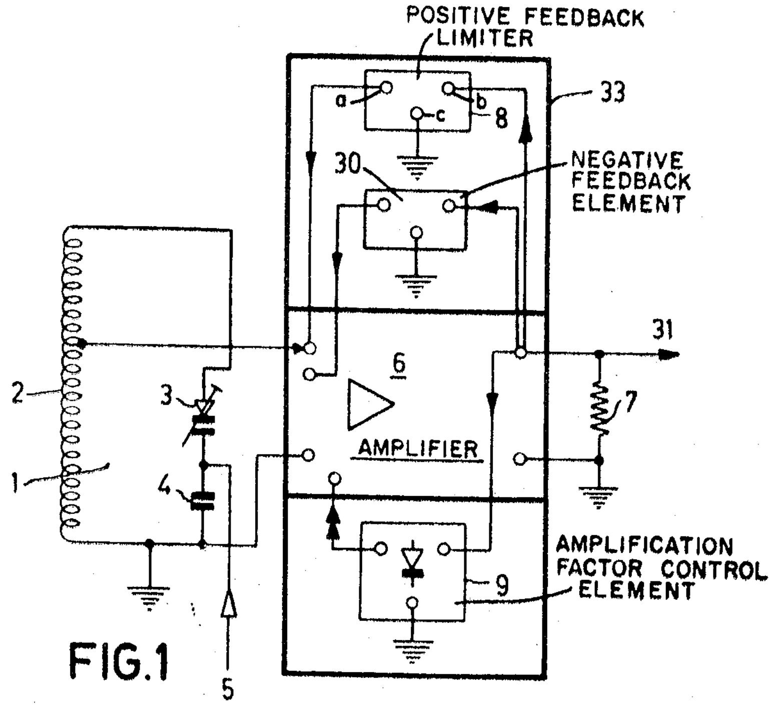
Figure 2:
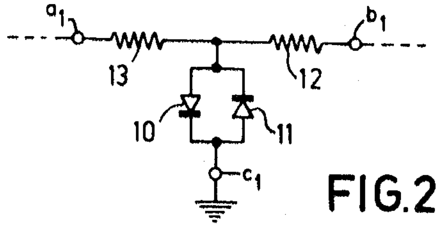
Figure 3:
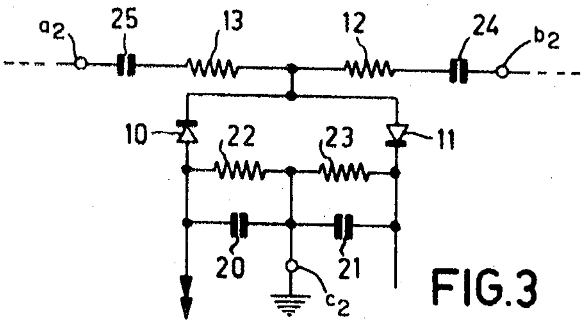

FIGURE 1 diagrammatically shows an oscillator circuit according to the invention, while FIGURE 2 shows a part of the feedback circuit constructed in a special manner which, as shown in FIGURE 3, also serves to obtain an amplifying control voltage.

In FIGURE 1, the resonant circuit 1 with the inductance 2 is tuned by means of a capacity diode 3 which, in series with a direct voltage blocking capacitor 4, is connected in parallel with the inductance 2. The inductance 2 may alternatively be a resonant element, for example, a part of a Lecher line or a circuit which can be tuned by varying a voltage-dependent capacity connected thereto. Between ground and a tuning control terminal 5 a back biasing voltage is applied to the diode 3. By means of this bias voltage the capacity is adjusted. The bias voltage at terminal 5 is preferably derived from a stabilized voltage source through a potentiometer circuit which may contain adjusting control members to compensate for the control range. This range is adjusted so that the capacity of the diode 3 within the control region varies as strongly as possible. Alternatively, an automatic frequency-readjusting voltage may be superimposed on it.

According to the invention, the resonant circuit 1 is connected, preferably in the manner shown in FIG. 1 through a tap in coil 2, to the input of a linear high-frequency amplifier 6 which preferably comprises at least one or two semiconductor amplifier stages. These may be integrated semiconductor amplifiers on a semiconductor body. A non-tunable impedance 7, for example, an ohmic resistor or an inductance, from which the output oscillations are derived for further stages of the circuit, for example, a mixer stage of a receiver, is connected to the output of the amplifier. For energizing the oscillator, a positive feedback coupling network 8 which is substantially independent of the frequency is connected between the output and the input. The feedback coupling network may consist, for example, of a series resistor or a T-member. As a result of the feedback network the part of the energy which is lost in the resonant circuit 1 by attenuation is returned from the output of the amplifier and a self-generation is achieved. At the same time the network 8 limits the effect of the internal capacity of the output of the amplifier 6 on the resonant circuit 1.

In order to ensure that the amplitude of the oscillator output does not become large enough to drive the amplifier 6 out of its linear range, a control quantity is derived from the output of the amplifier 6 by the resistor 7, which adjusts the amplification factor of the amplifier 6 so that the output amplitude and consequently the input amplitude are substantially constant. For that purpose the output amplitude may be applied to a device 9 which comprises, for example, a back-biased rectifier. When a threshold voltage which corresponds to the desired value of the output amplitude is exceeded, the rectifier supplies a control quantity as a result of which the operating point of at least one amplifier element is shifted so that the amplification is decreased and consequently the output amplitude is stabilized. So the control may operate continuously or only from a given threshold value onwards.

As a result of the action of the limiter 9, the generated oscillations at the output impedance 7 are limited to such a value that the amplifier 6 is just driven in a linear range. The oscillation applied to the input terminal of the amplifier 6 then has a comparatively low amplitude, in the case of a semiconductor amplifier, only 0.1 volt. If the capacity diode 3 is connected in the manner shown in FIGURE 1, a rather large feedback oscillation amplitude becomes necessary as a result, it is true. As a result, however, the capacity variation of the diode 3 caused as a result of the control voltage at the terminal 5 produces a larger frequency variation of the oscillator output than if the diode 3 were connected directly between the input terminals of an amplifier having a comparatively large internal input capacity.

A limitation of the amplitude of the fed-back oscillations and consequently a restriction of the amplitude at the resonant circuit 1 may alternatively be achieved when the feed-back coupling network 8 shown in FIGURE 2 comprises diodes which are arranged parallel with opposite polarities and have internal threshold values in the order of a few tenths of a volt. The terminals $a_1$, $b_1$ and $c_1$, of the network shown in FIG. 2 may be connected to corresponding terminals *a*, *b* and *c* of FIG. 1.

As long as the fed-back oscillations across the diodes do not exceed the threshold value thereof, the diodes remain non-conductive. However, when the oscillations do exceed said threshold value, the diodes pass current and they limit the amplitude of the fed-back oscillations. In this case a distortion of the oscillations occurs. Since the output oscillations must be sinusoidal, the diode limiter 10, 11 should be decoupled from the output, for example, by a series resistor 12. The oscillations also at the resonant circuit 1 must not be adversely influenced by the diodes 10, 11; so the diodes are decoupled from the input, for example, by a series resistor 13. The resistors 12 and 13 must together be proportioned so that the voltage decrease required for feedback coupling is effected from the output to the input.

With a feedback coupling network shown in FIGURE 2, the feedback amplitude may only be limited. Variations in the attenuation of the resonant circuit 1 and/or of the amplification could still occur so that an amplitude stabilization circuit 9 should preferably be used in addition. The amplifying control voltage may be derived from the limiting diode in the feedback coupling network if, as shown in FIGURE 3, the diodes are connected through the series arrangement of two resistors 22 and 23 shunted by capacitors 20 and 21, one point of which is connected to earth. Terminals $a_2$, $b_2$ and $c_2$ of FIG. 3 may be connected to terminals *a*, *b* and *c* respectively of FIG. 1. A control voltage at the capacitors 20, 21 is derived which corresponds to the amplitude of the feedback oscillations which exceeds the threshold value of the diodes 10 and 11. When the feedback coupling branch is decoupled from direct current, for example, by blocking capacitors 24 and 25, one end of the series arrangement of the capacitors 20, 21 may be connected to earth and the control voltage may be derived from the other end. Other known circuit arrangements for producing the control voltage may alternatively be used.

For the adjustment and control, respectively, at a desired value of the output ampliude at the impedance 7, other known means may alternatively be used, for example, a resistor having a negative temperature coefficient which is connected parallel to the impedance 7 and the resistance of which decreases noticeably when the amplitude increases. In order to amplify this control effect, the current which flows through this resistor may be fed back negatively to the input of the amplifier 6.

In order to obtain the required linearly of the amplifier 6, a negative feedback may be carried out in known manner. This will be of advantage in particular, when the amplifier 6 is to be driven strongly, so as to minimize the number of required circuit elements. For this negative feedback a network 30 may be connected inside or outside the amplifier 6 between its input circuit and its output circuit, as is shown in FIGURE 1. In order to obtain the correct phase condition, a possibly required phase-shift, in particular a phase shift of approximately 180°, may be effected in the network 30, or by a connection to the output or the input of the amplifier 6.

As a rule the negative feedback coupling network 30 cannot be connected between the same input terminals and output terminals as the positive feedback coupling network 8 but it is connected to a different input point of the amplifier 6. Such different input points are, for example, the base and the emitter of a transistor.

The required positive feedback of energy to the resonant circuit 1 through the network 8 may also be carried out through another coupling, for example, a current coupling through a tap at the inductance 2.

The feedback coupling network 8, the negative feedback coupling network 30, and the circuit 9 for the amplitude control, may be combined to form one assembly, preferably as an integrated circuit, on a semiconductor plate 33 which in FIGURE 1 is denoted by a circumferential line. In this case very little space is required, and a large electrical and mechanical stability is obtained. Of course the output resistor and/or the capacity diode branch 3, 4 may also be arranged on the semiconductor plate so that only the resonant circuit 1 and a line 31 for deriving the oscillator output have to be connected. The integrated circuit may also contain circuit elements which may constitute parts of at least one of the coupling networks, the value of which varies with temperature in such manner that a temperature compensation is obtained with respect to the frequency and/or the amplitude of the generated oscillations.

What is claimed is:

1. An amplitude stabilized oscillator comprising a resonant circuit formed by an inductance and a voltage dependent diode capacitor, an amplfier, means coupling a portion of said inductance to the input of said amplifier, a positive feedback coupling network coupled between the input and output of said amplifier for energizing said amplifier to produce oscillations, said coupling network including a feedback limiting circuit having first and second diodes oppositely poled and connected in parallel between a point commonly connected between said amplifier input and output and a point of reference potential, and amplification control means connected to the output of said amplifier and responsive thereto for adjusting the operating point of said amplifier.

2. The combination of claim 1 wherein said coupling network further includes first and second series connected circuits, each of said circuits comprising a parallel connected resistor and capacitor, said series circuits connecting the ends of said diodes remote from said common point.

3. An amplitude stabilized oscillator comprising a resonant circuit formed by an inductance and a voltage dependent diode capacitor, an amplifier means coupling a portion of said inductance to the input of said amplifier, a negative feedback circuit connected to the output of the amplifier and feeding back a portion of the output thereof, a positive feedback coupling network coupled between the input and output of said amplifier for energizing said amplifier to produce oscillations, said coupling network including a feedback limiting circuit having first and second diodes oppositely poled and connected in parallel between a point commonly connected between said amplifier input and output and a point of reference potential, and amplification control means connected to the output of said amplifier and responsive thereto for adjusting the operating point of said amplifier.

References Cited

UNITED STATES PATENTS

| | | |
|---|---|---|
| 2,936,428 | 5/1960 | Schweitzer. |
| 3,233,197 | 2/1966 | Deichen. |

ROY LAKE, Primary Examiner

S. H. GRIMM, Assistant Examiner

U.S. Cl. X.R.

331—117, 167, 177, 183